United States Patent [19]

Afzali-Ardakani et al.

[11] Patent Number: 5,527,593
[45] Date of Patent: Jun. 18, 1996

[54] STRUCTURES FABRICATED FROM TOUGHENED POLYCYANURATE

[75] Inventors: Ali Afzali-Ardakani, Yorktown Heights; Jeffrey T. Gotro, Endwell; Jeffrey C. Hedrick, Peekskill; Konstantinos Papathomas, Endicott; Niranjan M. Patel, Wappingers Falls, all of N.Y.; Jane M. Shaw, Ridgefield, Conn.; Alfred Viehbeck, Fishkill, N.Y.

[73] Assignee: International Business Machines Corporation, Armonk, N.Y.

[21] Appl. No.: 344,477

[22] Filed: Nov. 23, 1994

Related U.S. Application Data

[62] Division of Ser. No. 923,723, Jul. 31, 1992.

[51] Int. Cl.$^6$ ...................... B32B 3/00
[52] U.S. Cl. .................. 428/209; 428/901
[58] Field of Search .................. 428/260, 209, 428/901

[56] References Cited

U.S. PATENT DOCUMENTS

| | | | |
|---|---|---|---|
| 4,745,215 | 5/1988 | Cox et al. | 560/301 |
| 4,902,752 | 2/1990 | Shimp | 525/390 |

Primary Examiner—Christopher W. Raimund

[57] ABSTRACT

An electronic circuit package comprising an electrically conductive pattern embedded within a curable material. The curable material comprises a fluorine-containing cyanate and a fluorine-containing arylene ether polymer. The cyanate is a monomer having the structure $$N\equiv C-O-R-[R^1]_n-O-C\equiv N$$

and the fluorine containing arylene ether polymer has the structure $$X-R-[R^1]_m-X$$

wherein X is any group capable of reacting with a $-C\equiv N$ group;

R is an aliphatic or aromatic group which may or may not be fluorosubstituted;

$R^1$ is an aliphatic or aromatic group which may or may not be fluoro substituted or $R^1$ is selected from the group consisting of ether, carbonyl, sulfone, phosphine oxide and sulfide, and at least one of R or $R^1$ must be fluoro substituted;

n is 0–10; and m is 0–100.

The material in the cured state comprises a fluorine-containing polycyanurate network having a plurality of discrete phases of the fluorine-containing thermoplastic polymer dispersed therein. The thermoplastic polymer phases are of submicron size.

11 Claims, 6 Drawing Sheets

CYANATE MONOMER

↓ HEAT

CYANATE PREPOLYMER

↓ HEAT, CAT.

POLYCYANURATE THERMOSET

STRUCTURES FABRICATED FROM TOUGHENED POLYCYANURATE

This application is a division of application Ser. No. 07/923,723, filed Jul. 31, 1992, pending.

BACKGROUND OF THE INVENTION

1. Technical Field of the Invention

The present invention relates generally to a curable cyanate resin composition having enhanced fracture resistance as a result of the incorporation of reactive thermoplastic oligomers therein. More specifically, the present invention relates to a composition comprising dicyanate ester resins containing at least one thermoplastic polymer modifier which is soluble in the dicyanate ester resin. Said thermoplastic polymer undergoes an in-situ phase separation process during cure to form a microphase-separated multiphase thermoset material.

Accordingly, the present invention embodies low dielectric constant materials with adjustable properties such as glass transition temperature and fracture toughness. The modified cyanate resin has a low dielectric constant and when impregnated into various types of reinforcements, yields insulating materials with either a controlled coefficient of thermal expansion (CTE) or a very low dielectric constant or both.

Furthermore, this invention relates to a curable material useful in conducting heat or electricity comprising a modified cyanate resin material and inorganic or metal particles which exhibits high thermal stability, adjustable glass transition temperature with controlled CTE.

Furthermore, the present invention relates to a curable material useful in the fabrication of prepreg layers for use in the manufacture of electronic packaging structures, adhesives and aerospace structural articles.

Furthermore, this invention relates to a material for use in electronic packaging applications where a thermoset material is required which has low dielectric constant and adjustable properties such as glass transition temperature and fracture toughness, and a process for making the material.

More particularly, this invention relates to a modified cyanate resin material useful in the fabrication of printed circuit boards, semiconductor chip carriers, metal-core boards, reaction injection molded (RIM) cards, multichip modules, and multilayer thin film circuit structures, which may include more than one conductive layer and may incorporate electrical interconnections including throughholes or vias between two or more conductive layers or blind vias between two layers. This invention is well suited for use as a substrate material for surface mounted electronic components.

In addition, this invention relates to an improved material and printed circuit board made therefrom comprising a modified cyanate resin material and reinforcement which exhibits high thermal stability, adjustable glass transition temperature, flame retardancy with either a controlled CTE, or low dielectric constant or both.

2. Prior Art

Polycyanurate thermosets based upon certain cyanate ester resins possess a number of attractive properties such as low dielectric constant, excellent thermal stability, low moisture uptake, high glass transition temperature, and processability characteristics analogous to epoxy resins (melt or solution processable).

Other attractive properties of these polycyanurate thermosets include, methyl ethyl ketone solubility, no volatile formation upon curing, outstanding adhesive properties, photoimageability (if desired) and inherent flame retardancy.

However, use of these polycyanurate thermoset materials in electronic packaging applications (e.g., prepregs, laminates, circuit boards) is limited due to their brittle nature which makes them susceptible to cracking when stressed or during processing such as via formation. This inherent brittleness is due to the high crosslink density of the networks which results in poor fracture toughness. Although there have been significant efforts to enhance the fracture toughness of the aforementioned polycyanurates, further improvement in the mechanical properties of these materials is required in order to make them useful in packaging. (As used herein, "fracture toughness" is a measure of how much energy is needed to propagate a crack in the plastic.)

U.S. Pat. No. 4,147,360 to Prevorsek et al., discloses a composition containing a crosslinked polycyanurate network in which a high molecular weight polyester carbonate, is finely dispersed, This reference is similar to the present invention in that a thermoplastic is chemically incorporated into a polycyanurate thermoset to enhance the physical properties.

In Prevorsek et al., the chemical structures of both the cyanate ester resins and the thermoplastic modifier are different from those disclosed in the present invention. The present invention discloses highly fluorinated materials that possess high $T_g$'s, low dielectric constants, inherent flame retardancy, and methyl ethyl ketone solubility.

Prevorsek et al. describe the use of solvent "to cause simultaneous precipitation of the thermoplastic polymer and dicyanate monomer."

Contrary to Prevorsek et al., the present invention describes for the first time, a fluorine-containing thermoplastic polymer (i.e., a modifier) which actually dissolves in the dicyanate monomer resin. So essentially, the dicyanate is a solvent for the modifier polymer. This phenomenon is one key to obtaining microphase separation during thermal curing of the composition of the present invention and hence the resulting improved mechanical properties. This is different from the approach utilized by Prevorsek et al. where what phase separation that does occur, occurs during solvent evaporation, well before the thermal cure. This is an important distinguishing feature that allows for the very small phases present in the present invention.

U.S Pat. No. 4,902,752 to Shimp discloses toughening polycyanurates with thermoplastics. Shimp discloses other relevant prior art references therein, the contents of which are hereby incorporated by reference herein. More particularly, Shimp discloses curable compositions made from blends of polycyanate esters of polyhydric phenols in admixture with amorphous, aromatic thermoplastic resins which are initially soluble in the polycyanate ester but which phase separate during curing. The reactant materials of Shimp will not function according to the present invention because they are difficult to process and the solvents used inherently raise environmental concerns. In the present invention the chemical structures of both the cyanate ester resin and the thermoplastic are different from those disclosed by Shimp et al.

European Patent Application 0 412 827 A2 to Mackenzie et al., discloses a fiber reinforced resin composition containing a polyarylsulfone thermoplastic compound and a cyanate ester resin. This reference is similar to the present invention in that a thermoplastic is chemically incorporated into a polycyanurate thermoset to alter the physical properties. One difference between the present invention and the reference is that the chemical structures of both the cyanate ester resins and the thermoplastic modifier are different. The present invention embodies highly fluorinated materials that possess high $T_g$'s, low dielectric constants, inherent flame retardancy, and methyl ethyl ketone processability. The resin composition described by Mackenzie et al. is not methyl ethyl ketone soluble, does not possess flame retardant properties and does not possess an inherently low dielectric constant. These attributes are unique to the present invention and are essential for electronics applications where solution processing is utilized.

U.S. Pat. No. 4,745,215 to Cox et al. discloses that dicyanate diphenyl hexafluorinated alkanes can be impregnated into suitable reinforcing fabrics and heat cured at elevated temperatures above their glass transition temperatures, i.e., about 320° C. for 1 hour. The cured products have favorable properties for high temperature and/or electrical insulation uses, such as in laminated circuit boards. These properties include low dielectric constants, high glass transition temperatures and high thermal degradation temperatures. However, it is also recognized that such systems have low fracture resistance and therefore need to be improved for use in electronic packaging.

SUMMARY OF THE INVENTION

The present invention comprises a novel modified polycyanurate resin possessing enhanced fracture toughness and improved drillability. The modifiers suitable for use are tough, ductile engineering thermoplastics possessing relatively high glass transition temperatures ($T_g$) (i.e., between about 140° and 200° C.) which when combined with the polycyanurate network do not reduce high temperature stability. The materials have a high $T_g$, low dielectric constant and can be processed with conventional techniques.

The present invention improves the fracture toughness of thermosetting polymers based on the cyanate ester chemistry. It involves the incorporation of specifically tailored thermoplastic polymers into a thermoset network. These modifiers have an inherent low dielectric constant, and coupled with the use of fluorinated dicyanates, yields thermoplastic modified (TPM) polycyanurate material with a low dielectric constant. The polymer blend composition has significantly enhanced fracture toughness and high resistance to thermal degradation.

Polymeric materials used for printed circuit boards require fracture toughness, i.e. the ability to avoid surface cracks resulting from handling and use. Currently used materials such as epoxy resins (FR4) have a fracture toughness in the range of 70–90 J/m². Untoughened polycyanurates have a fracture toughness in the range of 50–70 J/m². The modified polycyanurates of the present invention, on the other hand, have a toughness as high as 100–680 J/m².

The polycyanurate of the present invention is fluorinated having low dielectric constant. The monomer precursor to the fluorinated polycyanurate is a dicyanate compound or prepolymer thereof or both, alone or in combination referred to herein as a "resin." The dicyanate resin is mixed with a thermoplastic polymer. The thermoplastic has been tailored to be soluble in the fluorinated dicyanate resin. The thermoplastic is synthesized to contain similar chemical substituents to those on the polycyanurate. This similarity retards phase separation of the polycyanurate and the thermoplastic. When the mixture is heated, the monomer begins to crosslink. As the molecular weight of the polymerizing monomers increases, the thermoplastic additive becomes slightly less compatible with the polymerized monomers and begins to phase separate. When the crosslinking reaction is complete, the final composition contains a fluorinated polycyanurate with thermoplastic phases on the submicron scale which it is believed, results in the substantial increase in fracture toughness. If a prepolymer is used, the reaction proceeds in the same manner. Optionally, by blending different cyanate monomers such as one having low $T_g$, and one having high $T_g$ an intermediate $T_g$ material is formed which maintains the physical properties of the high $T_g$ material, such as the desired fracture toughness.

Cyanate ester resins are bisphenol derivatives containing the ring-forming cyanate (—C≡N) functional group. This family of thermosetting monomers and their prepolymers are esters of bisphenols and cyanic acid which cyclotrimerize to form substituted triazine rings upon heating. Conversion, or curing, to high $T_g$ thermoset material forms three-dimensional networks of oxygen-linked triazine rings and bisphenol units, correctly termed polycyanurates. The cyclotrimerization reaction is classified as addition polymerization. A schematic of the crosslinking mechanism is shown in FIG. 1.

The cyanate structures embodied within the scope of the present invention are:

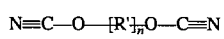

wherein R is an aliphatic or aromatic group which may or may not be fluorosubstituted;

R' is an aliphatic or aromatic group which may or may not be fluorosubstituted, or it can be ether, carbonyl, sulfone, phosphine oxide, sulfide, or nothing, and at least one of R or R' must be fluorosubstituted, and n is 0–10

The cyanate that can be used pursuant to the present invention also comprises prepolymers of said monomers or blends thereof.

Some suitable flourinated cyanate structures that fall within the scope of the invention are:

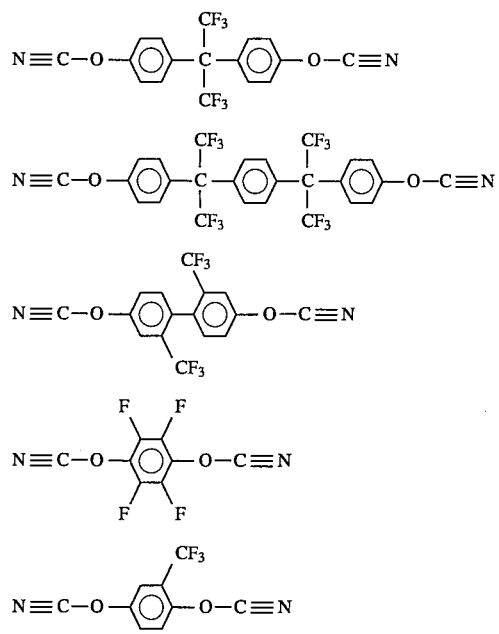

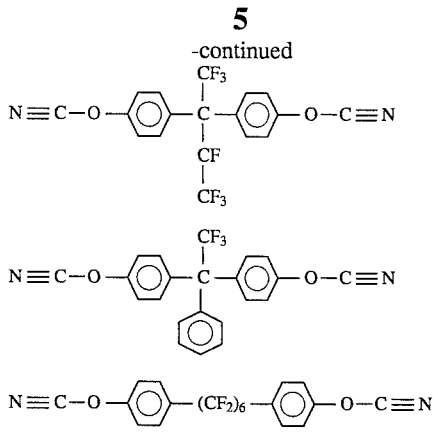

The thermoplastic modifiers used as modifiers in accordance with the present invention are:

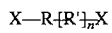

wherein X is any group capable of reacting with a —CN group, such as hydroxyl, amino, cyanato, epoxy; and wherein R is a aliphatic or aromatic group which may or may not be fluorosubstituted;

R' is an aliphatic or aromatic group which may or may not be fluorosubstituted or it can be ether, carbonyl, sulfone, phosphine oxide, sulfide, or nothing, and at least one of R or R' must be fluorosubstituted, and n is 0–100.

Specific examples of suitable thermoplastic modifiers that can be used in the present invention are:

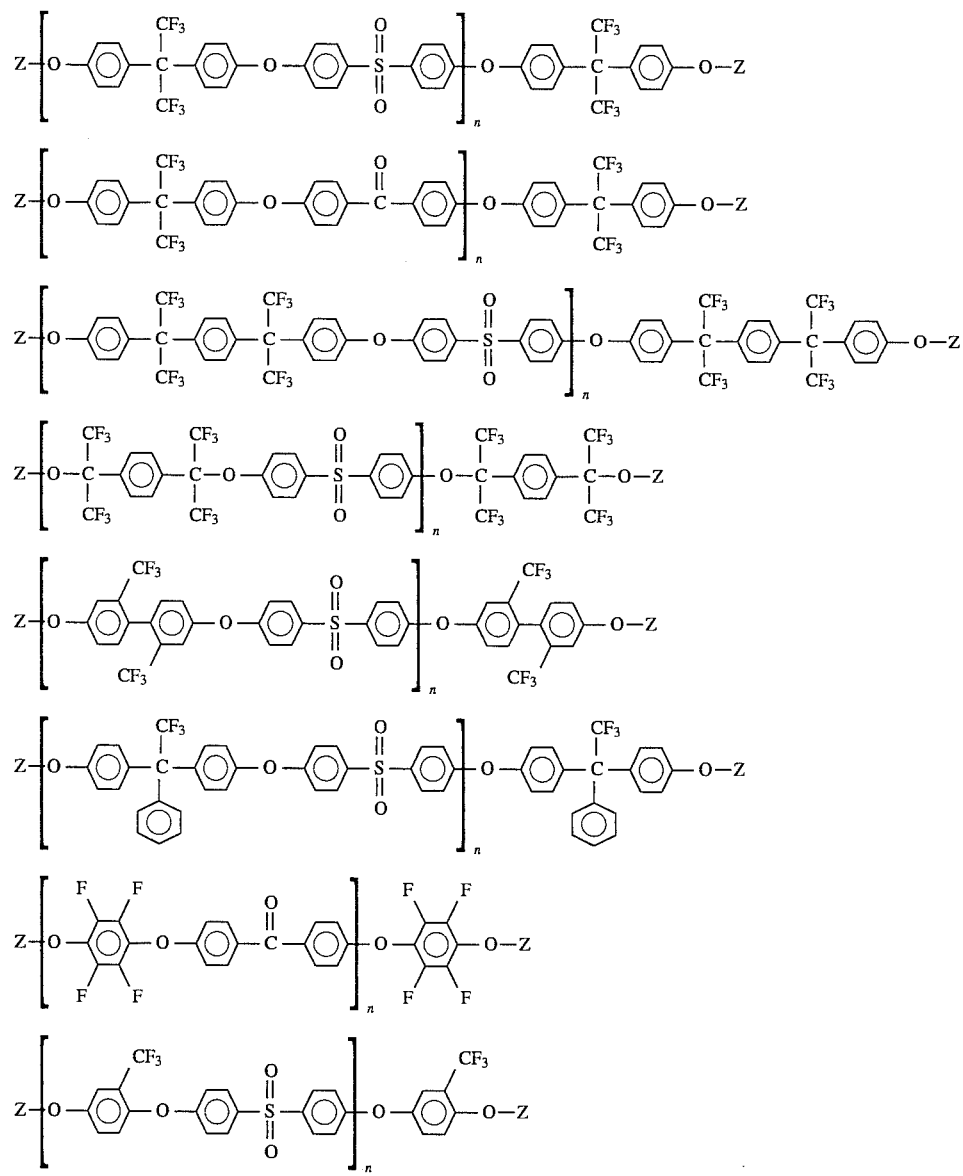

Z = H or C ≡ N or ANY REACTIVE MOIETY THAT WILL REACT WITH A CYANATE ESTER FUNCTIONALITY

As depicted above, suitable modifiers include any fluorine containing poly(arylene ether), or other thermoplastic which is compatible with the cyanate ester resin comprising monomer, prepolymer or blend thereof.

As noted above, in the reaction used to form the network, the cyanate polyomer initially acts as a solvent for the thermoplastic modifier.

The reaction begins first by branching and chain extension within the cyanate monomer and between cyanate groups and endgroups of thermoplastic resin.

As the cyanate resin becomes highly branched and crosslinked, thermoplastic polymer chains start forming domains as driven by thermodynamic principles and the reaction proceeds substantially to completion.

At the end of the reaction, these domains have grown into phases of microscopic sizes (angstroms to microns) rich in thermoplastic surrounded by a highly crosslinked matrix of polycyanurate network.

Useful features which have been designed into the aforementioned system include:

1. A thermoplastic polymer is used which is initially soluble in dicyanate ester resin at a temperature of approximately 20° C. above the melting point of the resin (100°–110° C.). This thermoplastic undergoes an in-situ phase separation process during network formation to form a microphase separated multiphase network. To achieve these criteria the backbone structure of the thermoplastic modifier is selected and designed with the intent of maximizing compatibility. Of the many systems tested, only the fluorine based modifiers were found to have the required miscibility with the dicyanate resin which is a prerequisite for achieving the subsequent network properties.

2. Methyl ethyl ketone solubility of the thermoplastic makes this a system which is compatible with today's industrial environmental requirements. This is essential so that this material can be processed with the existing technologies currently utilized in the fabrication of printed circuit boards. Typically, high $T_g$ thermoplastics of this type are only soluble in polar aprotic solvents or chlorinated solvents which are not environmentally acceptable.

3. The introduction of reactive functional groups (i.e., hydroxyl, amino or cyanato) on the terminal ends of the thermoplastic modifier is especially beneficial. This allows the thermoplastic to be chemically incorporated (covalently bonded) into the network structure. Chemical incorporation enhances the compatibility of the modifier and results in a more uniform morphology. It also insures that solvent resistance in the cured network is maintained.

4. Molecular weight control of the thermoplastic modifier is provided. The solubility, morphology, modulus, and fracture toughness of the modified polycyanurates are a function of the molecular weight of the thermoplastic modifier. Typically, the optimum molecular weight is in the range of 13,000 to 18,000 g/mol. This molecular weight range is just above the critical molecular weight for entanglements of these polymers. If melt processability is desired, lower molecular weights (5,000 to 13,000 g/mol) may be required to reduce the melt viscosity.

5. Optimal composition of the thermoplastic modifier in the fluorinated dicyanurate resin ranges between 5 to 40 weight/weight percent. The resulting properties such as fracture toughness, morphology, modulus, dielectric constant, etc. are all a function of chemical nature of the modifier which has been designed in this case to provide improved mechanical performance without sacrificing the desirable properties of the polycyanurate thermoset material.

6. The backbone structures of the thermoplastic modifiers are tailored to reduce their dielectric constants. This is achieved by the incorporation of fluorine containing moieties in the backbone of the polymer.

Another aspect of the present invention is the modification of the properties of the polycyanurate resins disclosed herein and more specifically, to provide thermosetting resins resulting from the cyclotrimerization of 4,4'-(hexafluorobisphenol AF dicyanate) (6F-Dicyanate) with a lower Tg high performance dicyanate e.g. 4,4'-(1,3-phenylenediisopropylidene) diphenylcyanate (M-Dicyanate) and a thermoplastic based upon bisphenol AF poly(arylene ether sulfone) or poly(arylene ether ketone). This produces cured laminates having reduced cure temperatures and improved fracture toughness compared to the 6F-Dicyanate based networks. The resulting resins display high temperature resistance, low dielectric constants and most importantly, flame resistance. Some additional non-fluorinated cyanate structures that tall within the scope of the invention are:

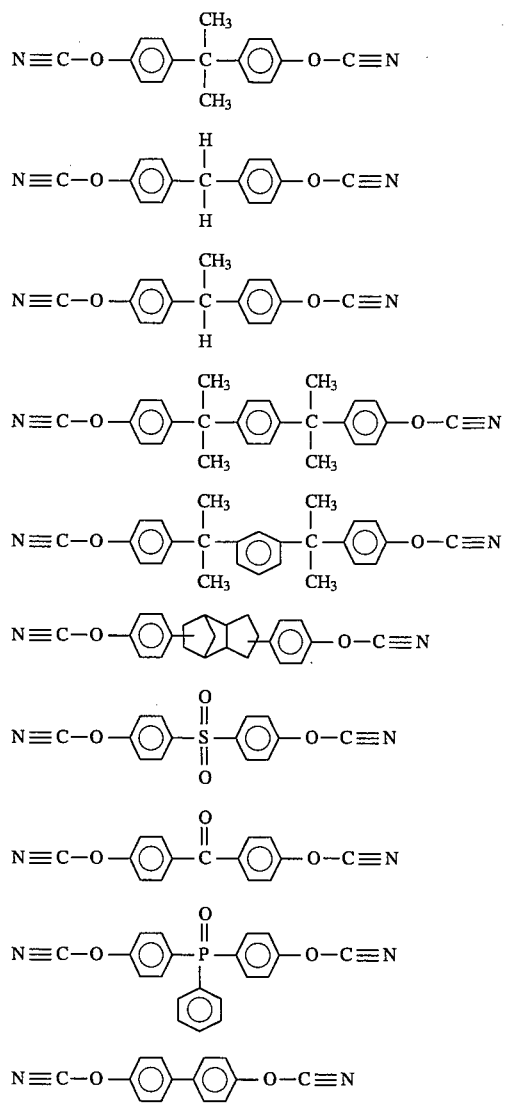

In addition, the properties (i.e., mechanical dielectric, thermal, adhesive, morphological and flame retardant) may be modified by blending with other thermosetting resins such as epoxy, bismaleimide, benzocyclobutene, bisnadimide and diacetylene resins. An illustrative partial list of suitable thermosetting resins that fall within the scope of the invention are:

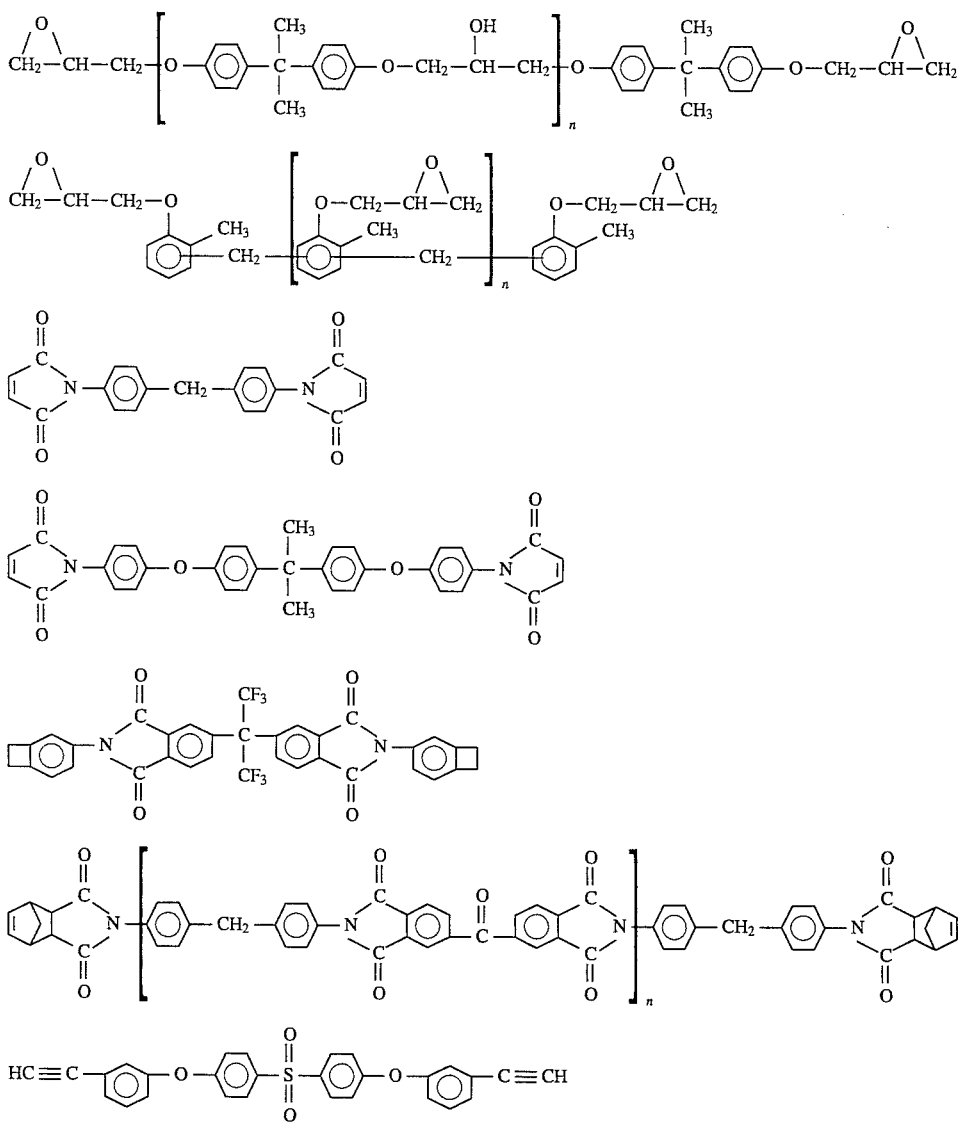

A further embodiment of this invention is a polycyanurate material having enhanced fracture toughness to permit the fabrication of composites having high percentage loading of metal or inorganic particles. Incorporation of metal, inorganic particles, pigments or fillers often have a deleterious effect on the mechanical properties of a composite which generally comprises a thermoset binder. The fillers act as sites where stress is concentrated and increase the modulus which in turn decreases the fracture toughness. The use of a modified cyanate resin overcomes this deficiency.

Composite materials comprising the modified polycyanurate and conducting metal particles, pigments or fillers are useful in fabricating conductive articles and/or adhesives. Examples of conductive metals useful in the present invention are copper, nickel, gold, platinum, palladium, zinc and others or alloys or mixture thereof. Such composites are useful in making electrical contacts or interconnections in electronic device application, or for shielding and electrostatic discharge uses. Electrically conductive adhesives are another possible use for electrically conductive modified polycyanurates. Higher conductivities are possible with the system since they allow greater loading without sacrificing mechanical properties.

Composite materials comprising the modified and thermally conductive particles pigments, or fillers are useful in fabricating heat conductive articles and/or adhesives. Examples of thermally conductive fillers include boron nitride, zinc, oxide, aluminum nitride and diamond.

Heat conductive composite materials are used for thermal management of electronic packaging, power supply systems, chip attachment, and heat sink attachment. Heat conductive materials are needed for removing resistive thermal energy or distributing the heat over a larger surface area to facilitate its transfer into the environment through air convection, or by contact with a liquid or a solid.

Future high performance or high density circuit packaging will operate at higher temperature due to the increased density of integrated circuits and greater power which necessitates the use of enhanced heat conductive materials having improved glass transition temperatures and fracture toughness as provided by the modified polycyanurate material.

The thermoplastic modified polycyanurates of this invention have been shown to have far higher temperature stability (up to 300° C.) than epoxy resins. The adhesion to of polycyanurates to metals, notably to copper, is in the range of 8–11 lbs/inch. In addition, the dielectric constants of the modified (toughened) polycyanurates are much lower (2.6–2.8) than for epoxy resins (3.5–4.0). Furthermore, the improved fracture toughness of the modified polycyanurates permit higher loading of the conductive pigments to provide greater heat conductivity without sacrificing mechanical integrity.

It has been determined that hollow glass spheres or silica sphere fillers can be used to reduce the dielectric constant of glass reinforced composites. For example, the hollow glass spheres or silica spheres can be usefully blended into the prepreg in the range of between about 25 and 65 volume percent, each of the spheres having a diameter in the range of between about 5μ and 25μ. A more complete discussion of the effect of the incorporation of these spheres into the prepreg and with respect to the reduction of dielectric constant is found in IBM disclosure EN 989,020 the contents of which are hereby incorporated by reference herein.

With the increased use of surface mount and direct chip attach technologies, there is a need to have a dielectric material possessing a low coefficient of thermal expansion (CTE). Typical epoxy/glass cloth composites have CTE's in the range of 15–30 ppm/°C. depending on the resin content. Silicon has a CTE in the range of 3–5 ppm/°C.

It has been determined that the composition of the present invention impregnated into a reinforcing matrix of glass fabric, a woven or nonwoven mat made of a material such as an aramid fiber or a metal film such as a copper/Invar/copper composite can successfully reduce the in-plane CTE.

One embodiment of the present invention is the use of the blend composition to form glass cloth reinforced dielectrics. For many years, glass cloth has been used to reduce the in-plane CTE in epoxy/glass cloth composites. The glass acts as a constraining layer, thus reducing the CTE of the ply. The most common glass cloth is E-glass. The drawback of E-glass has been its high dielectric constant. By using glass cloth, the dielectric constant of the ply is increased. Therefore, there is a need to use a combination of a low dielectric constant thermosetting resin and a lower dielectric constant woven-glass cloth.

DESCRIPTION OF THE INVENTION

Preferred Embodiments

Figure 1:
FIG. 1 is a schematic formula representation showing the crosslinking mechanism that occurs during reaction.
Figure 1:
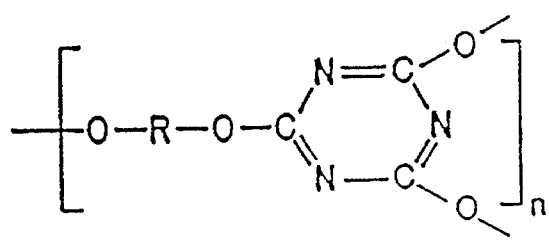
Figure 1:
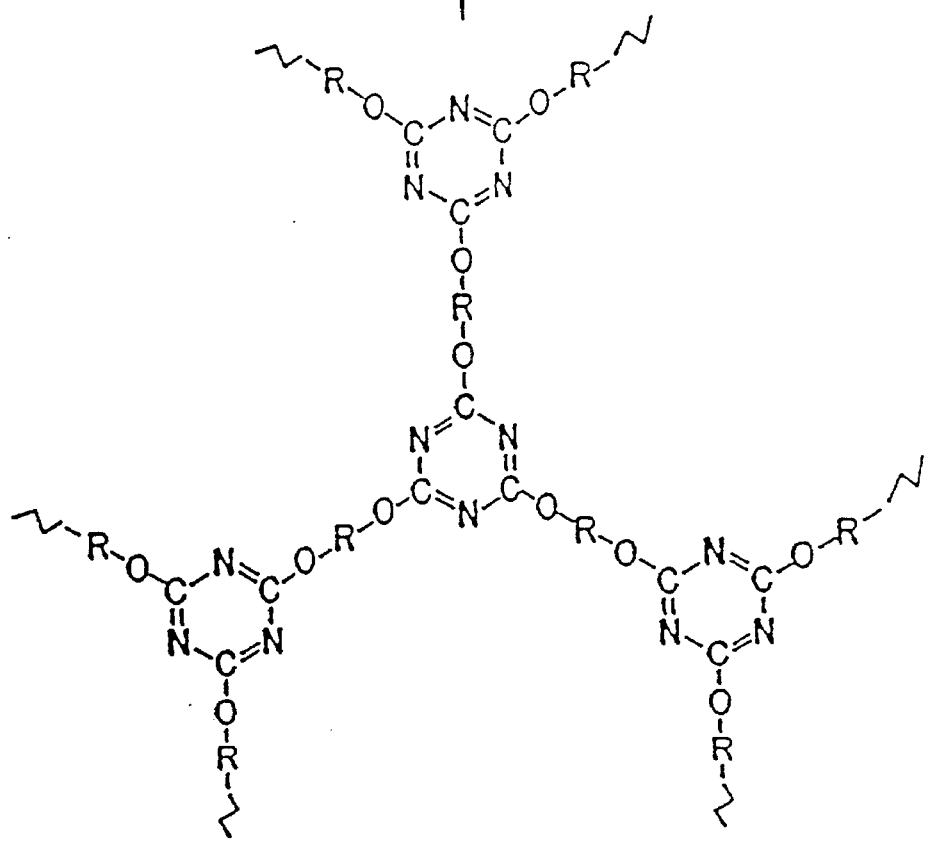

While the present invention relates to dicyanate ester resins, preferably the invention relates to hexafluoroisopropylidene dicyanate ester resins containing a thermoplastic polymer which is soluble in the dicyanate ester resin. This thermoplastic polymer undergoes an in-situ phase separation process during network formation to form a microphase-separated multiphase thermoset material. Reactive functional groups such as a hydroxyl group modifier permit the modifier to be incorporated by covalent bonding into the polymer network structure. Using monomers containing fluorine groups provides a lower dielectric constant. Examples of such thermoplastic modifiers include (a) poly(arylene ether sulfone) prepared by reacting bisphenol AF with 4,4'-difluorodiphenylsulfone; and (b) a poly(arylene ether ketone) made by reacting bisphenol AF with 4,4'-difluorobenzophenone. Thermoplastic modified polycyanurates are prepared by reacting M-dicyanate and 6F-dicyanate with the thermoplastic modifier in two stages. In the first stage, the thermoplastic modifier and dicyanate ester resins are mechanically mixed under vacuum at 130° C. to form a transparent homogeneous mixture. In the second stage the reactants were cured at about 200° to 250° C. for one hour and at about 250° C. to 325° C. for two hours.

The polycyanurate networks in this case are based upon the reaction of M-dicyanate and 6F-dicyanate with a thermoplastic modifier shown below:

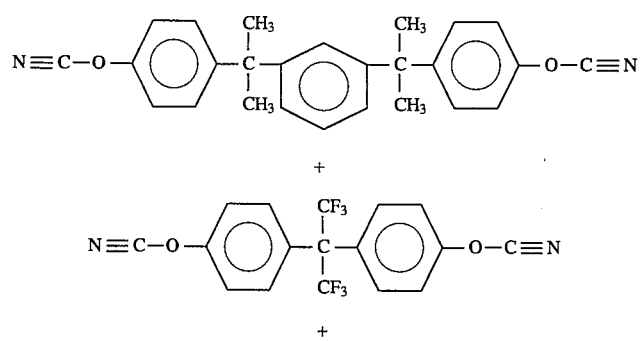

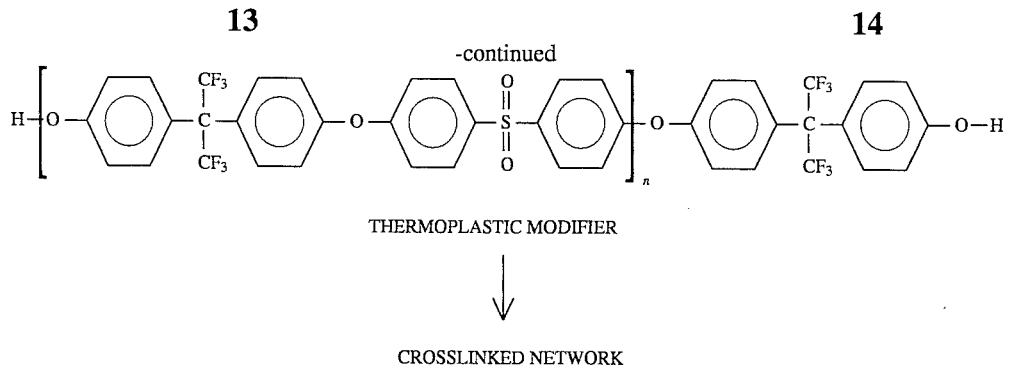

THERMOPLASTIC MODIFIER

↓

CROSSLINKED NETWORK

Both of the specific preferred sulfone and ketone thermoplastic modifiers noted above are successfully incorporated into networks in a range of 5 to 40 wt/wt percent preferably between 15 and 30 wt/wt percent.

The thermoplastic modifiers used in the present invention can be conveniently synthesized via nucleophilic aromatic substitution reactions. A poly(arylene ether sulfone) is synthesized by reacting bisphenol AF with 4,4'-difluorodiphenylsulfone. Likewise, the poly(arylene ether ketone) is synthesized by reacting bisphenol AF with 4,4'-difluorobenzophenone. In the course of the reaction, molecular weight and endgroup functionality are controlled by offsetting the stoichiometry in the reaction according to the Carrothers equation. An excess of the bisphenol AF reactant is utilized to achieve hydroxyl endgroups and an approximate number average molecular weight of 15,000 g/mol for both polymers.

A common way of reducing in-plane CTE of cured laminates is to solution impregnate or melt impregnate the cyanate resin into a woven glass cloth. The choice of the specific glass cloth will dictate the dielectric constant of the resulting composite structure. E-glass is the most commonly utilized cloth fabric, however, it has a dielectric constant of about 5.8. The resulting composite with cured polycyanurate will be in the range of 3.4 to 3.5.

Other glass cloths such as S-glass, D-glass, K-glass or Q-glass possess lower dielectric constants in the range of 3.2–3.4 and result in a cured laminate possessing a dielectric constant in the range of about 3.0–3.2.

The invention described here also involves solvent impregnation of a solution of the thermoplastic modified fluorinated cyanate blend into aramid fibers. Both DuPont (tradename Thermount) and Teijin Ltd (tradename Technora) have developed chopped aramid fiber mats. A typical aramid fiber mat, suitable for use in the present invention is the mat made from co-poly-phenylene 3,4'-oxydiphenylene terephthalamide referred to as "PPODTA." The in-plane CTE of a mat such as a PPODTA mat (without resin) is on the order of −6 to −7 ppm/°C. ($10^{-6}$ in/in/°C.). At a resin content of 50–60%, the in-plane CTE is in the range of 3–8 ppm/°C. This is very closely matched with the CTE of silicon and would not require the use of encapsulants to stabilize the chip during thermal cycling. To illustrate the benefits of the invention, the Er of the PPODTA paper is 3.5. At 60 percent resin content the dielectric constant is about 2.8 to 3.0.

Another strategy for lowering the in-plane CTE of a composite is to use copper/Invar/copper as the constraining layer and also to serve as a power core. There are two approaches to fabricating this type of core. The first involves laminating a reinforced dielectric sheet, such as the S-glass, D-glass, or Q-glass dielectrics. The added benefit here is that the overall in-plane CTEs of both the Cu/Invar/Cu and the dielectric ply are low. Dielectric plies fabricated using the modified cyanate resins impregnated into the DuPont Thermount or Teijin Technora mat can also be utilized to fabricate a controlled CTE encapsulated power core structure.

Figure 2:
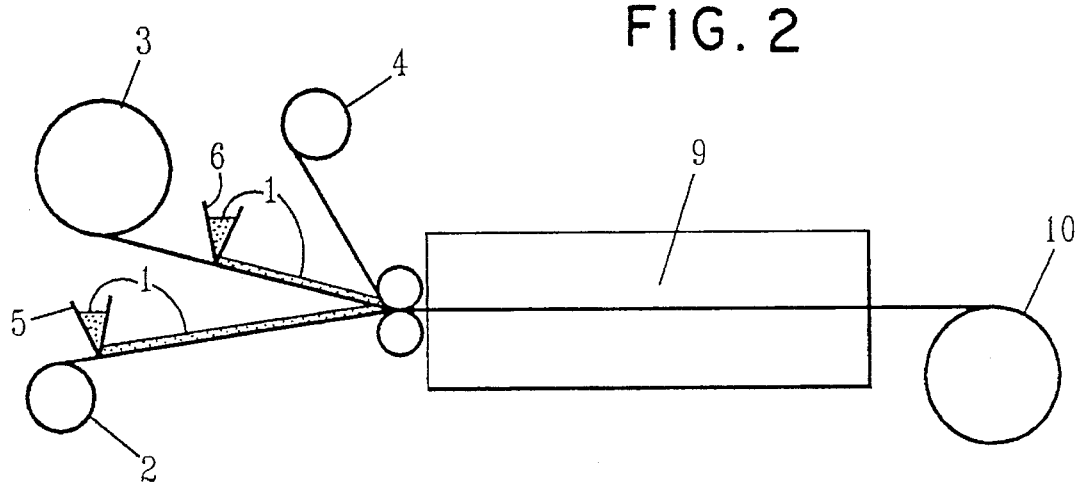
FIG. 2 is a schematic of a continuous lamination process.

An alternate method is to coat the Cu/Invar/Cu core using a continuous lamination process as depicted in FIG. 2. The advantage of this method is that it is continuous and uses no solvents. Due to the unique compatibility of the thermoplastic modifier in the cyanate resins, the Cu/Invar/Cu core can be coated using a melt process. A layer of melted resin 1 is applied to the continuously moving upper surfaces of webs of Cu strip 2 and upper Cu strip 3 of the core using a doctor blade or slit extrusion heads 5, 6. A web of Cu foil 4 is secured to resin layer 1 atop strip 3 at pressure rolls 7 and 8 and then between heated platens 9 (now shown) under pressure. The temperature of the platens 9 is maintained in the range of 180°–325° C. In the double belt lamination portion of the lamination process, pressure is applied initially at rolls 7 and 8 and the temperature of platens 9 is rapidly increased through the range noted above, consolidating the resin and causing the crosslinking reaction to occur. The curing temperature is dependent on the composition of the cyanate blend ratio of M-Dicyanate to 6F-Dicyanate. The resulting product is wound on roll 10.

Copper clad cores may be fabricated by placing multiple plies of prepreg between oxide treated copper foils and laminating under heat and pressure. Typically, the lamination process involves heating the copper foil and prepreg stack at between 5° to 10° C./min to the final platen setpoint. The platen setpoint is determined by the final $T_g$ of the matrix resin. The ensure full cure during the lamination process, the final temperature is set to be approximately 25° C. above the $T_g$ of the fully cured matrix. The pressure is typically in the range of 200–500 pounds per square inch, with the preferred pressure being 300 pounds per square inch. Thermoplastic modified cyanate prepregs may be laminated at ambient pressures, or the preferred method is to use vacuum lamination. With vacuum lamination method, the environment in the vicinity of the prepreg/copper stack is evacuated to a pressure of −29.5 inches Hg using either a vacuum frame around the stack, or by enclosing the platens in a vacuum enclosure. The vacuum method is the preferred embodiment for making well consolidated, void-free laminates.

An alternate method for fabricating copper clad cores is to use a continuous lamination process. There are two embodiments of this method; the first involves continuously laminating prepreg manufactured using standard impregnation towers between two sheets of a continuously moving roll of oxide treated copper foil. Heat and pressure are applied by a highly polished stainless steel belt on both sides of the laminate. Typical double belt laminators are available from either Simplekamp or Held Corporations. The preferred embodiment involves the production of copper clad cores using a melt impregnation of the moving web. This eliminates the need for producing preprag on a large impregation tower. In this embodiment, the resin is melted and applied to a roll of reinforcement (E-glass, K-glass, D-glass, S-glass, Tachnora paper, Thormount paper) by a doctor blade or slit die extrusion head. A thin film of molten resin is applied to a continuously moving oxide treated copper foil and is placed in contact with the moving web of the reinforcement. Molten resin may be applied to the top surface of the moving reinforcement or applied to a second roll of oxide treated copper foil. Prior to entering the double belt portion, the two copper foils and the reinforcement materials are brought into contact. The molten resin is forced into the reinforcement in the consolidation zone of the double belt laminator with the further application of higher temperatures and pressure. The second method produces copper clad cores of high quality in a continuous fashion without having to handle large volumes of volatile solvents.

Another application utilizes the TPM cyanates impregnated into an expanded polytetrafluoroethylene (ePTFE) reinforcement. Due to the problems drilling woven expanded PTFE fibers, a new expanded PTFE mat was developed. Using a satisfactory process, a thermosetting resin is impregnated into the mat. In fact, a commercial product based on non-fluorinated bisphenol A dicyanate impregnated into an ePTFE mat is now available. The mat is available in a wide range of thicknesses. The advantage of using the TPM cyanates, over the commercial product, is that the fracture toughness of the matrix resin is substantially enhanced compared to the standard polycyanurate material. Furthermore, the dielectric constant of the TPM cyanates is lower compared with the non-fluorinated polycyanurates. The combination of the low dielectric constant of the toughened polycyanurates coupled with the extremely low dielectric constant of PTFE yields a dielectric layer with a dielectric constant in the range of 2.3–2.5 depending on the resin content. This provides a means to use a more conventional lamination approach (i.e. thermosetting polymer laminated in a flat-bed press).

Another embodiment of the present invention is the use of the composition thereof in electronic circuit packages. The general structures and manufacturing processes for electronic packages are described in for example, Donald P. Seraphim, Ronald Lasky, and Che-Yo Li, *Principles of Electronic Packaging,* McGraw-Hill Book Company, New York, N.Y., (1988), and Rao R. Tummala and Eugene J. Rymaszewski, *Microelectronic Packaging Handbook.* van Nostrand Reinhold, New York, N.Y. (1988), both of which are hereby incorporated herein by reference.

The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging,* pages 334–371, previously incorporated herein by reference, and by Donald P. Seraphim, Donald E. Barr, William T. Chen, George P. Schmitt, and Rao R. Tummala, "Printed Circuit Board Packaging" in Tummla and Rymaszewski, *Microelectronics Handbook,* pages 853–922, also previously incorporated herein by reference.

Articles can be used in electronic circuit packages prepared having a plurality of layers wherein at least one of the layers is formed of a curable material comprising a flourine containing cyanate and a fluorine containing thermoplastic polymer material which is cured. One or more of the remaining layers is formed of a thermoplastic or thermosetting resin, the particular resin to be selected based upon the desired properties to be utilized. To function efficiently as an electronic circuit package, the article described above contains electrically conductive metal patterns embedded therein which serve as a carrier for an electric circuit. Further discussion of electronic circuit packages is found in U.S. Pat. No. 5,103,293 to Bonafino et al., the contents of which are hereby incorporated by reference herein.

The articles formed are generally multilayer articles of two up to thirteen or fourteen layers comprising an electrically conductive circuit layer on a polymer, ceramic or multilayer substrate wherein the polycyanurate thermoset material of the present invention is applied over the electrically conductive circuit layer from a solvent solution or from a melt solution to provide a dielectric layer having a planarized outer surface after curing said thermoset material, said article being characterized in having one set or a plurality of alternating wiring networks in said thermoset material.

The other thermoplastic or thermosetting layers comprising the article can be the same or different and are selected from the group consisting of polyimide, photosensitive polyimide, epoxy, benzocyclobutene and polycyanurate formed from photosensitive cyanate resin.

EXAMPLE 1

Thermoplastic Modifier Synthesis—Bisphenol AF Polysulfone

To a 5 liter 4 neck round bottom flask equipped with a nitrogen inlet, thermometer, stirrer, and Dean Stark trap fitted with a condenser were charged 437.11 gm 2,2'-bis(4-hydroxyphenol)hexafluoropropane, 319.34 gm difluorodiphenylsulfone, 225 gm potassium carbonate, 1775 ml N-methyl-2-pyrrolidinone and 775 ml toluene. The stoichiometry of the reactants was varied according to the Carrothers equation to achieve hydroxyl-terminated oligomers of controlled molecular weight. The reaction contents were placed under nitrogen and heated until the toluene began to reflux at approximately 140°–155° C. The reaction mixtures was refluxed until complete dehydration was achieved (approximately 4 hours). The water released during phenoxide formation was collected and removed from the Dean Stark trap. Toluene was drawn from the Dean Stark trap until the reaction temperature reached 165°–170° C. The system was allowed to react for 10–12 hours, resulting in a viscous dark green solution. After cooling to approximately 80° C., the reaction mixture was filtered to remove the inorganic salts. The reaction solution was then acidified to a pH of less than 7 with glacial acetic acid and precipitated into a 10 fold volume of methanol and water in a ratio of 25/75 (vol/vol), respectively. The precipitated oligomer (light tan powder) obtained by filtration was washed with methanol and was then dried under vacuum at 100°–120° C. After drying the oligomer was redissolved in tetrahydrofuran (30% solids concentration) and the precipitation, filtration and washing procedures were repeated. Finally, the precipitate was dried at 120° C. to constant weight yielding approximately 700 gm of an oligomer possessing a molecular weight (<Mn>) of approximately 17,900 by size exclusion chromatography (GPC) and approximately 17,600 using a titration method with tetramethylammonium hydroxide in methanol. The oligomer possessed a glass transition temperature of 195° C. and a degradation temperature of approximately 525° C. as measured by thermogravimetric analysis under nitrogen.

The dielectric constant of the oligomer measured at 1 kHz was approximately 2.95.

EXAMPLE 2

Thermoplastic Modifier Synthesis—Bisphenol AF Polyetherketone

Using the same procedure described in Example 1, a bisphenol AF polysulfone oligomer was synthesized by charging 33,6236 gm 2,2'-bis(4-hydroxyphenol) hexafluoropropane, 21,0843 gm difluorobenzophenone, 17.3 gm potassium carbonate, 130 ml N-methyl-2-pyrrolidinone and 45 ml toluene into a 500 ml flask. The resulting oligomer possessed a glass transition temperature of 165° C. and a degradation temperature of approximately 550° C. as measured by thermogravimetric analysis under nitrogen. The dielectric constant of the oligomer measured at 1 kHz was approximately 2.85.

EXAMPLE 3

Preparation of Toughened High Tg Polycyanurate Thermoset Materials

To a 100 ml two neck round bottom flask equipped with a gas inlet and mechanical stirrer was charged 31.5 gm 4,4'-(hexafluoroisopropylidene)diphenylcyanate (AroCyF-10 resin from Rhone-Poulenc) and 13.5 gm bisphenol AF polysulfone (30 wt/wt percent). The mixture was heated to 120° C. with stirring. After melting of the crystalline solid occurred at approximately 90° C., the reaction was placed under vacuum for degassing and dissolution of the bisphenol AF polysulfone in the dicyanate resin. In approximately 0.5–1.5 hours, the mixture became homegenous and ceased bubbling, indicating that all of the moisture and dissolved gases were removed. At this point, the transparent, homogenous solution was poured into a preheated RTV silicone rubber mold containing shapes appropriate for mechanical property evaluation. Once filled, the mold was covered with a sheet of 0.01 mil Teflon and was weighted down with a 0.25 inch thick piece of aluminum. The mold was then placed into a forced-air convention oven and was cured under nitrogen at 200° C. for 2 hours and at 310° C. for an additional hour. The resulting samples were transparent and appeared to be completely homogeneous; however, dynamic mechanical analysis (DMTA) demonstrated two glass transition temperatures (Tg) at approximately 199° C. and 315° C. indicating phase separation. Attempts to characterize the phase separation with scanning electron microscopy (SEM) and transmission electron microscopy (TEM) were unsuccessful suggesting a very high degree of compatibility and submicron phase separation. The toughened thermoset samples exhibited fracture toughness values of Klc=1.03 MPa $\sqrt{m}$ and Glc=340 J/m2 from plain stain fracture toughness tests. The dielectric constant of the toughened thermoset at 1 kHz was approximately 2.7–2.8.

EXAMPLE 4

Preparation of a Reduced Cure Temperature Processable Toughened Polycyanurate A low Tg toughened polycyanurate network was prepared by blending a non-fluorinated dicyanate, specifically 4,4'-(1,3-phenylenediisopropylidene) diphenylcyanate (M-dicyanate), with 4,4'-(hexafluoroisopropylidene) diphenylcyanate (6F-dicyanate) in a 60/40 (wt/wt percent) ratio, respectively. Bisphenol AF polysulfone was also added in 15 wt/wt percent (based on cyanate monomer weight) for toughness enhancement.

For the sake of simplicity in describing the respective amounts of the constituents of the multi component blends used in the present invention, the percentages are set forth according to the sequence $A(NF_c/F_c)/B$ wherein A represents the total cyanate/polycyanurate composition in percent by weight of the blend; the symbols $NF_c/F_c$ represents the non-fluorinated cyanate/polycyanurate to fluorinated cyanate/polycyanurate in the total cyanate/polycyanurate composition with the non-fluorinated compound always listed first; and B represents the thermoplastic modifier expressed in percent by weight.

The mixture containing 11.9 gm of 6F-dicyanate, 17.85 gm of M-dicyanate and 5.25 gm of bisphenol AF polysulfone was prepared as described in Example 4.

A series of samples or varying blend compositions having various amounts of non-fluorinated and fluorinated polycyanurates and thermoplastic modifiers were prepared as described in Examples 3 and 4 herein. The resultant blends were formed into specific bars and tested for DMTA, fracture toughness and thermal analysis evaluation.

Figure 3:
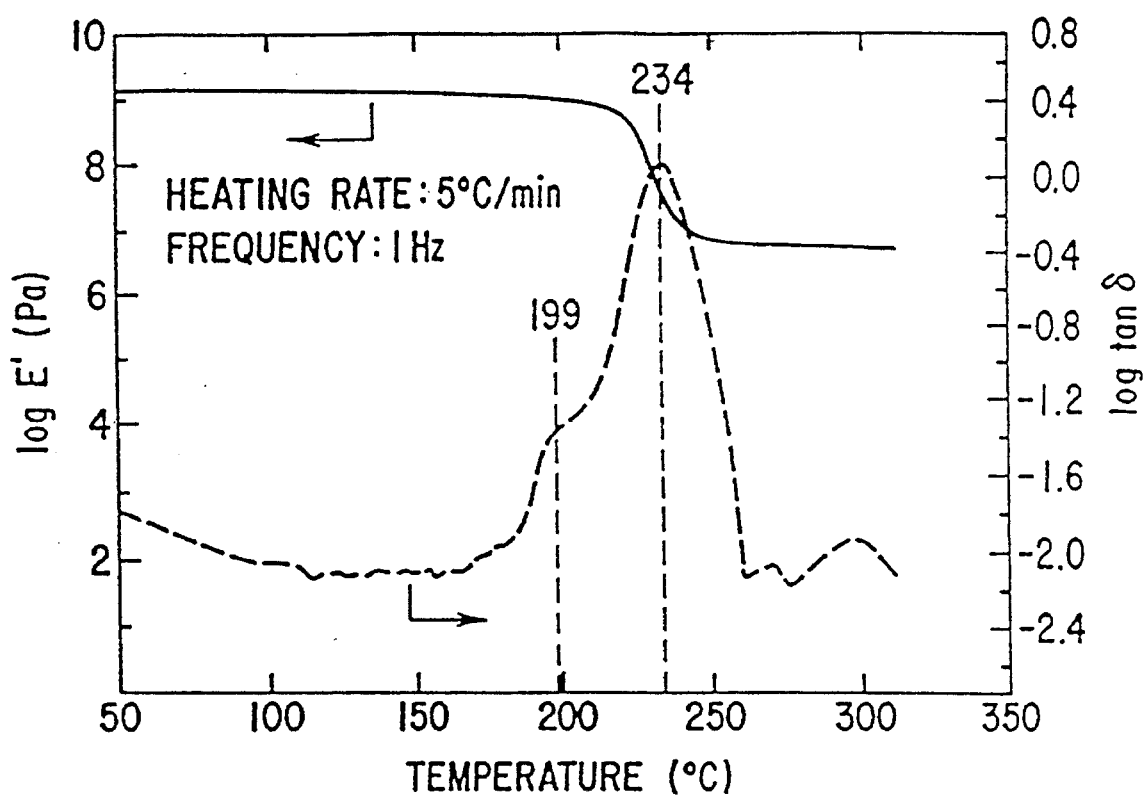
FIG. 3 is a plot of dynamic mechanical behavior of the composition of the present invention.

The dynamic mechanical behavior of modified polycyanurates materials prepared as described in this Example 4 is shown in FIG. 3 for a 85 (60/40)/15 composition. The tan δ trace demonstrates two transitions at 199° C. and 234° C. for the polysulfone and polycyanurate phases, respectively, indicating presence of phase separation. However, the samples were transparent and homogeneous, thus suggesting the phase separation is on the angstrom to nanometer scale.

Figure 4:
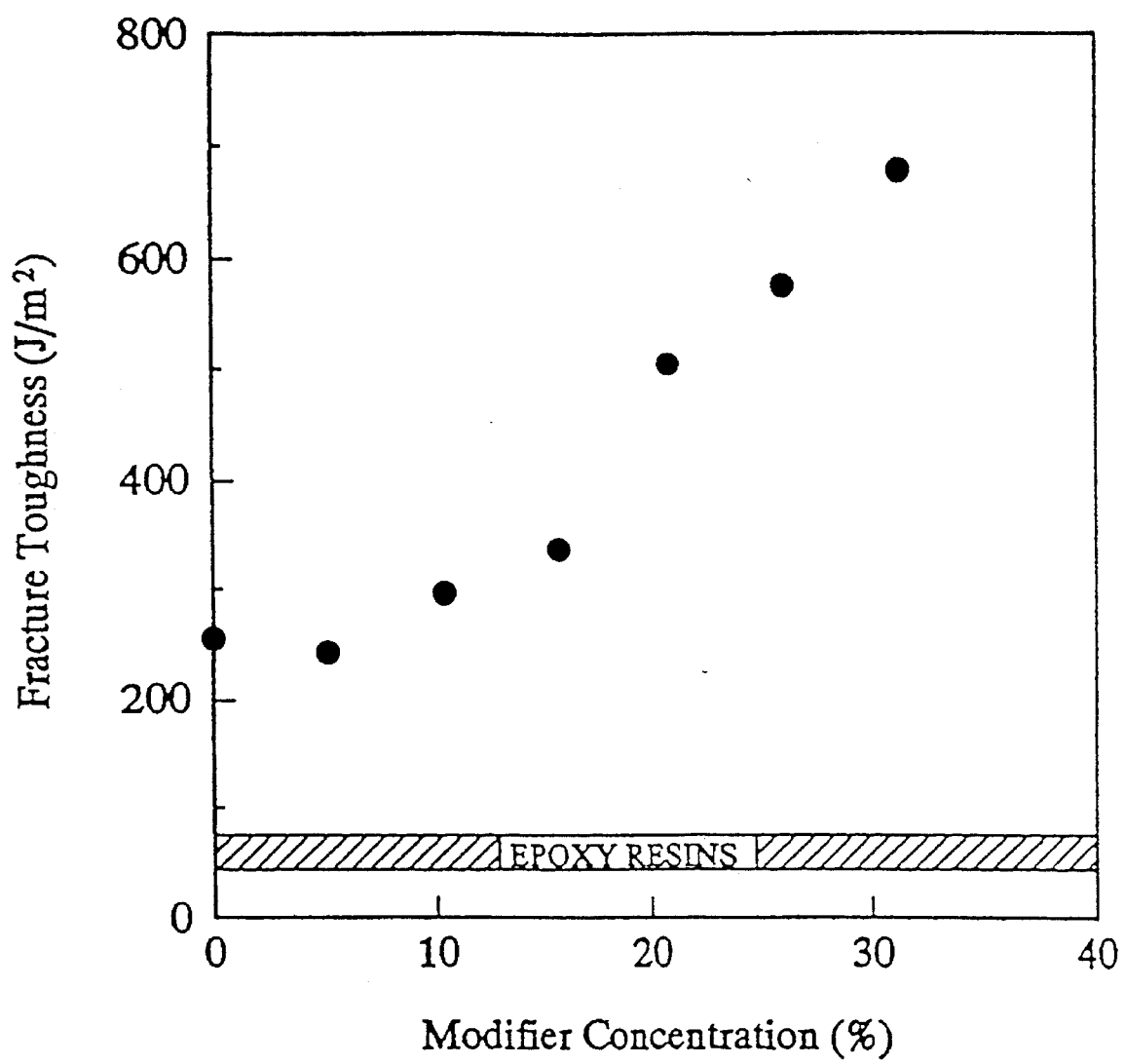
FIG. 4 is a plot showing the effect of thermoplastic modifier concentration on fracture toughness of the blends of the present invention.

Samples as detailed below were formed from blends having varying amounts of thermoplastic modifier contained therein according to the legend A(60/40)B. These samples were formed into test specimen bars and tested for fracture toughness. More specifically, FIG. 4 demonstrates the effect of the thermoplastic modifier concentration on the fracture toughness of modified polycyanurate thermosets containing 60% M-dicyanate and 40% 6F-dicyanate (wt/wt) utilizing bisphenol AF polysulfone as a modifier. From FIG. 4, it can observed that a substantial increase in the fracture toughness is achieved with increasing modifier concentration (B). Indeed, the toughness increases from 250 J/m² to >650 J/m² with 30% (wt/wt) incorporation of the thermoplastic modifier. Epoxy resins, on the other hand, only exhibit fracture toughness between 40–90 J/m².

Samples as detailed below were formed from blends having varying amounts of non-fluorinated and fluorinated material at a constant concentration of thermoplastic modifier of 15%, i.e. $[85(NF_c/F_c)15]$. These samples were formed into test specimen bars and tested for fracture toughness and thermal analysis, more specifically the glass transition temperature.

Figure 5:
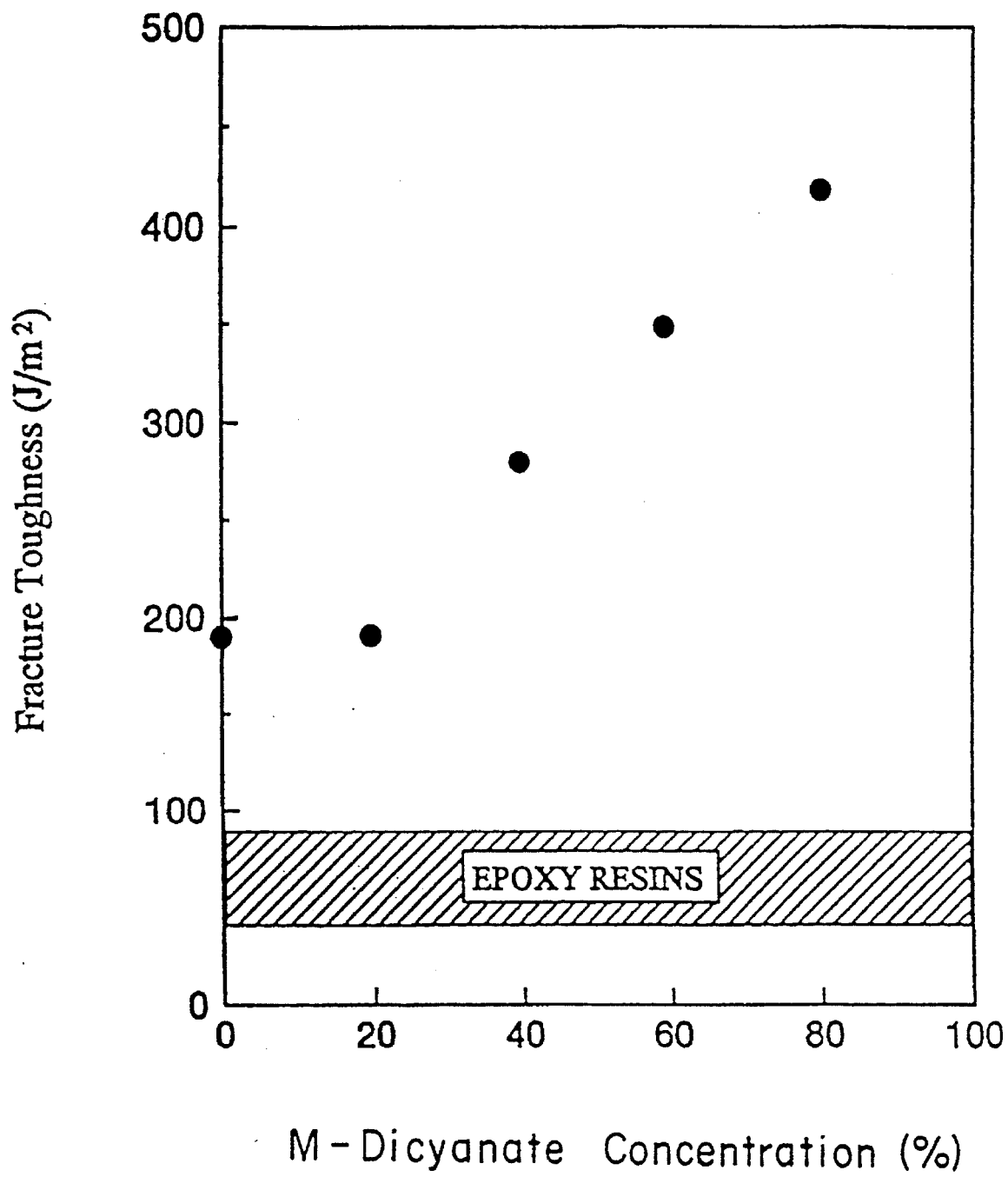
FIG. 5 is a plot of the effect of the cyanate blend composition on the fracture toughness of the blends of the present invention.

FIG. 5 demonstrates the effect of varying the cyanate blend composition (M-dicyanate and 6F-dicyanate) at a constant thermoplastic (bisphenol AF polysulfone) modifier level of 15% (wt. PSF/wt. cyanate resin). As the percentage of M-dicyanate is increased over the 6F-dicyanate component, the fracture toughness is relatively unaffected at low percentages (<20%) of M-dicyanate. However, as the percentage of M-dicyanate is increased (>20%) at a constant thermoplastic modifier contents of 15% (wt. modifier/wt/cyanate resin) the fracture toughness rises rapidly from 190 J/m² to >400 J/m².

Figure 6:
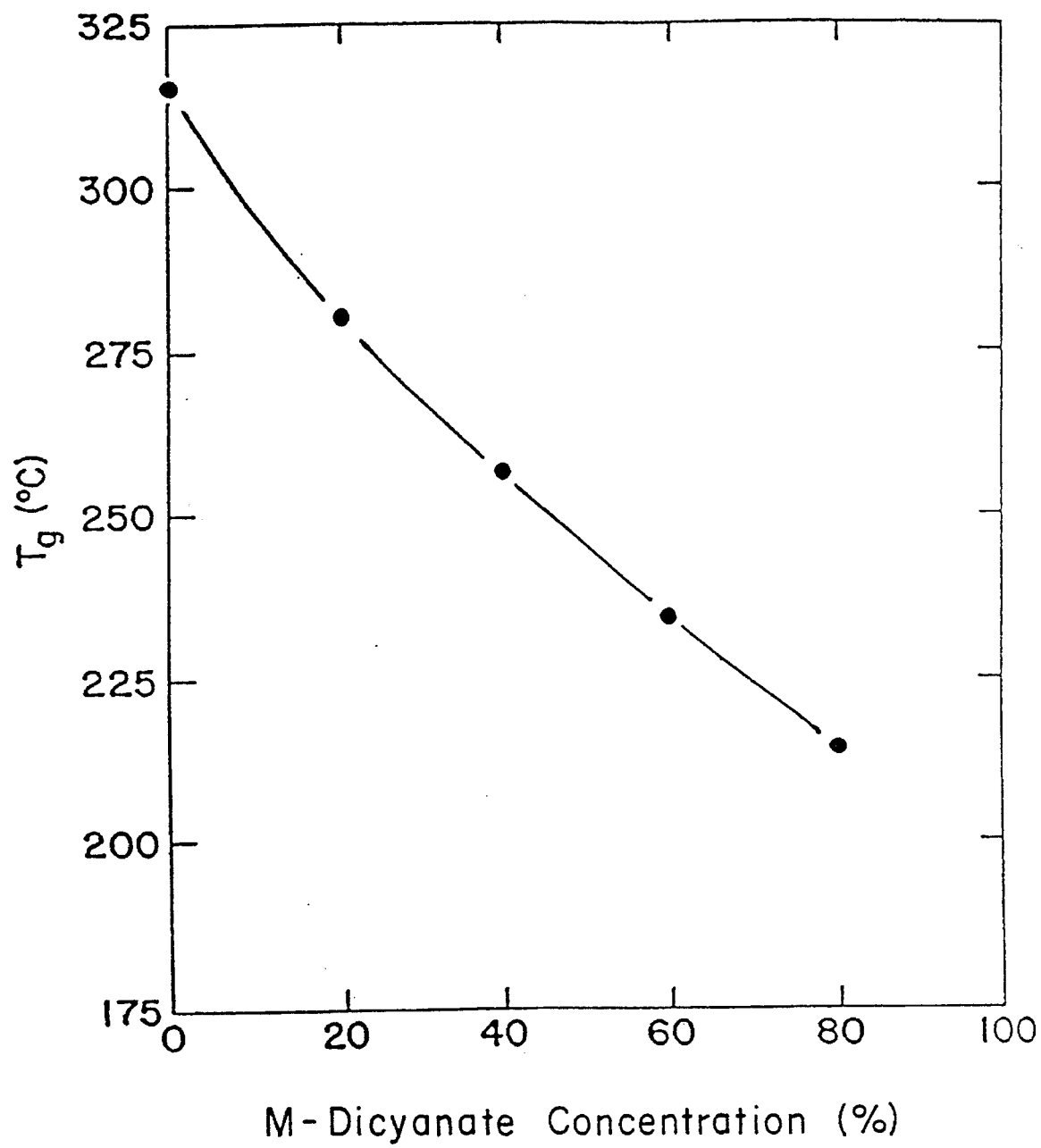
FIG. 6 is a plot of the effect of varying one of the cyanates in a cyanate blend on the thermoset $T_g$.

FIG. 6 illustrates the effect of cyanate resin blends on the thermoset (i.e. polycyanurate phase) Tg for blends of M-dicyanate in admixture with 6F-dicyanate mentioned above. FIG. 6 depicts that the ultimate Tg of the cured thermoset can be tailored with the blend composition. Furthermore, it demonstrates that the M-dicyanate and 6F-dicyanate are miscible (i.e., behave as a single component with no phase separation).

Figure 7:
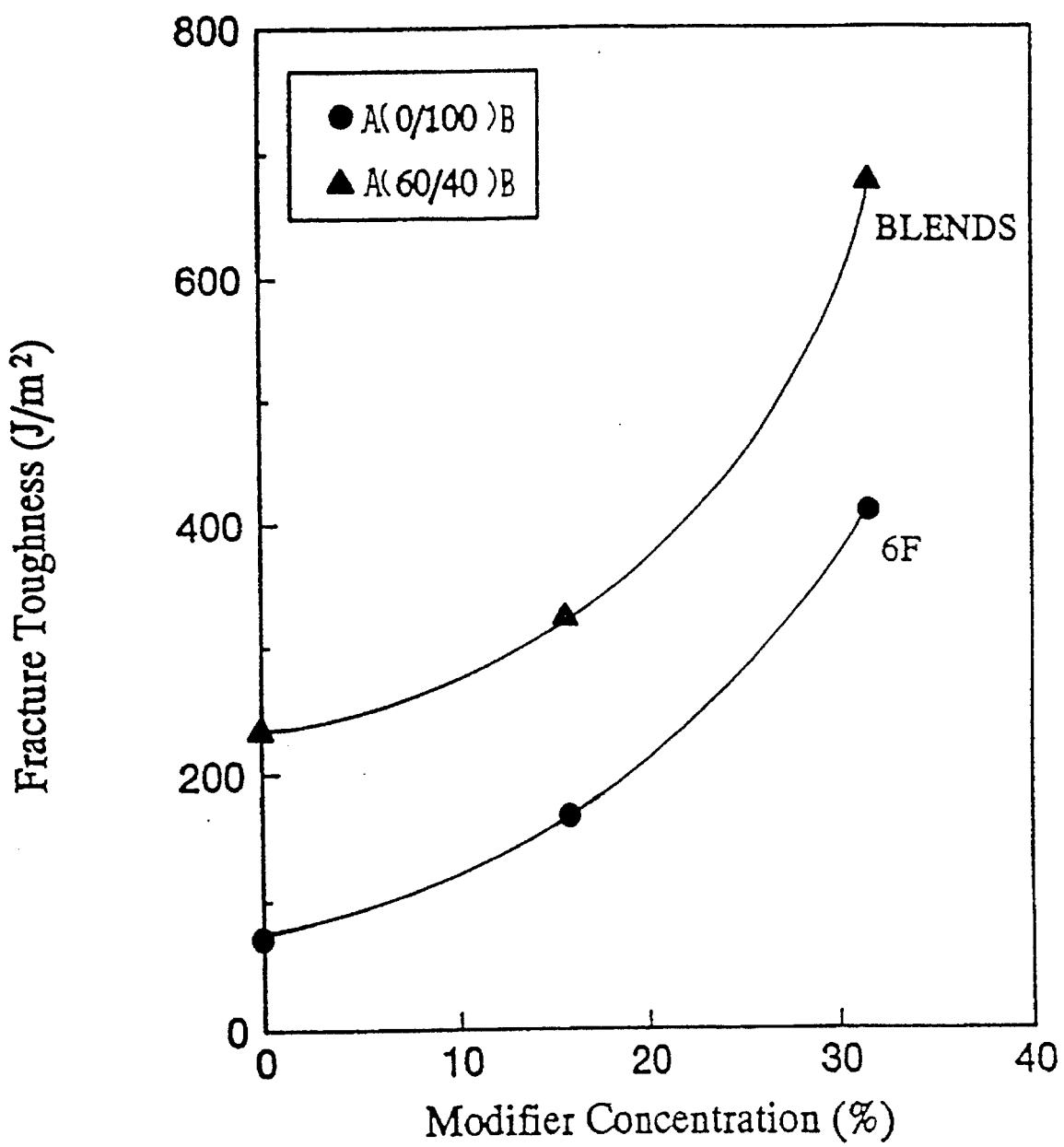
FIG. 7 is a plot of the effect of cyanate blends on the fracture toughness of the modified polycyanurates of the present invention.

Two sets of samples were prepared having varying types and amounts of polycyanurates and various amounts of thermoplastic modifier concentration [A(0/100)B and A(60/40)B]. FIG. 7 depicts the effect of the cyanate blend composition as a function of the thermoplastic modifier (bisphenol AF polysulfone) concentration. The curve labeled "6F" contains 100% of the 6F-dicyanate with varying percentages of the modifier. The curve labelled "blends" contains a 60/40 (wt/wt) blend of M-dicyanate and 6F-dicyanate, respectively, at various modifier concentrations. The blends, containing the more flexible M-dicyanate, exhibit a higher fracture toughness at all concentration levels.

EXAMPLE 5

Preparation of 106 E-Glass Prepreg/Laminates/Circuit Boards

A resin solution was prepared in a 2 liter beaker by mixing a 60/40 (wt/wt) blend of M-dicyanate prepolymer solution (598.4 gms of a 75% solution in MEK) with 6F-dicyanate propolymer solution (398.9 gm of a 75% solution in MEK) and 470.7 gm of MEK. After thorough mixing, 132 gm of bisphenol AF polysulfone (15 wt/wt percent) was added (portionwise) and was stirred mechanically until complete dissolution was achieved. The resulting varnish was crystal clear, amber colored liquid, indicating complete dissolution of all components in the methyl ethyl ketone. Approximately, one hour prior to use, the above mentioned resin solution was catalyzed with 200 ppm of manganese octanoate (25.0 gm of a 0.006% solution in MEK). The resin solution was impregnated into a 106 style, E-glass and K-glass reinforcing fabric using an impregnation treater tower. The resulting prepreg was heat treated at 140° C. for approximately 4 minutes to remove the MEK solvent and to "B-stage" the resin.

The prepreg was cut and laminated into test specimens which were used for determining the dielectric constant moisture absorption, coefficient of thermal expansion copper peel strength and interlaminate bond strength. The results of these evaluations are summarized in Tables 1–3.

Copper clad laminates, upon which the copper peel test was conducted, and circuit boards were prepared by superimposing several layers of the preptog between one or mere sheets of copper. These structures were cured at approximately 250° C. to 325° C. under approximately 300 psi of pressure for approximately two hours.

Parallel plate dielectric constant tests were conducted on the samples. The results are set forth in Table 1. Thermal analysis tests were also conducted on samples to determine the glass transition temperature.

TABLE 1

| COMPOSITION OF MODIFIED POLYCYANURATE | GLASS REINFORCEMENT | DIELECTRIC CONSTANT (AT 1 GH$_z$) | IN-PLANE CTE (PPM/°C.) BELOW T$_g$ | ABOVE T$_g$ |
|---|---|---|---|---|
| 95(60/40)/5 | E-glass | 3.5 | — | — |
| 90(60/40)/10 | E-glass | 3.4 | — | — |
| 85(60/40)/15 | E-glass | 3.4 | 16 | 8 |
| 80(60/40)/20 | E-glass | 3.4 | — | — |
| 85(20/80)/15 | E-glass | 3.4 | — | — |
| 85(60/40)/15 | E-glass | 3.5 | — | — |
| 85(80/20)/15 | E-glass | 3.5 | — | — |
| 85(40/60)/15 | K-glass | 3.2 | — | — |
| 85(60/40)/15 | K-glass | 3.2 | 13 | 6 |

Table 1 demonstrates that the dielectric constant was essentially unaffected by the addition of the thermoplastic modifier and by variation of the polycyanurate blend composition. However, it can be observed that a significant decrease in the dielectric constant was achieved by replacing the E-glass reinforcement with K-glass.

TABLE 2

| COMPOSITION (ALL E-GLASS LAMINATES) | MOISTURE ABSORPTION (percent weight gain) | |
|---|---|---|
| | 24 hour soak (room temp.) | 16 hours (boiling water) |
| FR-4 Epoxy Resin | 0.30 | 2.57 |
| 95(60/40)/5 | 0.30 | 0.55 |
| 90(60/40)/10 | 0.28 | 0.52 |
| 85(60/40)/15 | 0.28 | 0.53 |
| 80(60/40)/20 | 0.31 | 0.58 |
| 85(0/100)/15 | 0.57 | 1.01 |
| 85(20/80)/15 | 0.27 | 0.56 |
| 85(40/60)/15 | 0.10 | 0.42 |
| 85(60/40)/15 | 0.28 | 0.53 |
| 85(80/20)/15 | 0.50 | 0.83 |

Table 2 shows a comparison of the moisture absorption for a typical epoxy resin and several thermoplastic modified polycyanurate compositions. The results demonstrate at the absorption is significantly less for the modified polycyanurate compositions especially for the samples boiled in water for 16 hours.

TABLE 3

| COMPOSITION (ALL E-GLASS LAMINATES) | Copper Peel* Strength (lbs/in.) | Interlaminate Strength (lbs./in.) |
|---|---|---|
| 95(60/40)/5 | 7.4 | 8.8 |
| 90(60/40)/10 | 8.4 | 10.0 |
| 85(60/40)/15 | 8.5** | 10.2 |
| 80(60/40)/20 | 8.4 | 11.3 |
| 85(0/100)/15 | 9.4 | 8.6 |
| 85(0/100)/15 | 9.8 | 8.4 |

TABLE 3-continued

| COMPOSITION (ALL E-GLASS LAMINATES) | Copper Peel* Strength (lbs/in.) | Interlaminate Strength (lbs/in.) |
|---|---|---|
| 85(20/80)/15 | 9.3 | 9.0 |
| 85(40/60)/15 | 8.5 | 10.2 |
| 85(60/40)/15 | 4.8 | 4.0 |
| 85(80/20)/15 | 0.50 | 0.83 |

*All with 1 oz Gould copper foil, 90° peel test.
**85(60/40)/15 with enhanced surface treatment copper foil produced a value of 10.5 lbs/in., 90° peel test.

Table 3 demonstrates the results achieved for the copper peel and interlaminate bond strengths. Furthermore, interlaminate bond strength was directly proportional to the fracture toughness increases depicted in FIG. 3.

The values obtained for the copper peel strength are comparable to FR4 epoxy resin. The interlaminate bond strengths for the thermoplastic modified polycyanurates far exceed those of epoxy resins.

EXAMPLE 6

Preparation of co-poly-p-phenylene 3,4'-oxydiphenylene terephthalamide (PPODTA) Paper (aramid fiber mat) Prepreg/Laminates. PPODTA paper was dried in a forced air even for 1 hour at 110° C. to remove any residual moisture in the aramid fiber mat. Failure to dry the aramid fiber mat prior to impregnation results in blistering during the lamination of the composite. The resin solution described in Example 5 above was utilized, however, in order to get to good penetration of the resin solution, the solids content in the varnish was reduced to 45 percent. This significantly lowered the viscosity and permitted good wetting of the aramid fibers.

The resin solution was then impregnated into the aramid fiber mat using an impregnation treater tower. The resulting prepreg was heat treated at 140° C. for approximately 4 minutes to remove the MEK solvent and to "B-stage" the resin. Laminates were then fabricated by superimposing several layers of the prepreg and curing them at approximately 250° C. under approximately 300 psi of pressure for two hours. Test specimen bars were prepared and tested to determine dielectric constant and in-plane coefficient of thermal expansion.

The resulting laminates possessed a dielectric constant of 2.8 (as measured at 1 $GH_z$). The in-plane coefficient of thermal expansion was 14 ppm/°C. below $T_g$ and -7 ppm/°C. above $T_g$.

EXAMPLE 7

Thermally Conductive Toughened Polycyanurates

Solution cast films of thermally conductive polyoyanurates were prepared by adding 60 gm aluminum nitride (portionwise) to 85 gm of cyanate prepolymer in MEK (75% solids concentration). The cyanate prepolymers were in a ratio of 40/60 wt/wt percent M-dicyanate/6F-dicyanate. Propylene glycol monomethylether acetate (PGMEA) was added as a "tail solvent" such that the overall ratio of MEK to PGMEA was 4:1 respectively. The mixture was milled in a vessel containing steel shots as media. Following milling, 6.0 gm bisphenol AF polysulfane (50% solids concentration in MEK) and approximately 100 ppm catalyst were added with stirring. The mixture was then coated on a substrate, dried under vacuum (for solvent removal) and cured at 180° C. for 2 hours and at 220° C. for an additional hour to form heat conductive dielectric composites. The above procedure can be applied to other heat conductive pigments like aluminum oxide and boron nitride.

What we claim and desire to protect by Letters Patent is:

1. An electronic circuit package comprising an electrically conductive pattern embedded within a curable material, said curable material comprising a fluorine-containing cyanate and a fluorine-containing arylene ether polymer wherein said cyanate is a monomer having the structure $$N{\equiv}C{-}O{-}R{-}[R^1]_n{-}O{-}C{\equiv}N$$

said fluorine containing arylene ether polymer has the structure $$X{-}R{-}[R^1]_m{-}X$$

wherein X is any group capable of reacting with a $-C{\equiv}N$ group;

R is an aliphatic or aromatic group which may or may not be fluorosubstituted;

$R^1$ is an aliphatic or aromatic group which may or may not be fluoro substituted or $R^1$ is selected from the group consisting of ether, carbonyl, sulfone, phosphine oxide and sulfide, and at least one of R or $R^1$ must be fluoro substituted;

n is 0–10; and m is –100;

said material in the cured state comprising a fluorine-containing polycyanurate network having a plurality of discrete phases of said fluorine-containing thermoplastic polymer dispersed therein wherein said thermoplastic polymer phases are of submicron size.

2. The electronic circuit package of claim 1 wherein said curable material further comprises a nonfluorine-containing cyanate having the structure $$N{\equiv}C{-}O{-}R^2{-}[R^3]_n{-}O{-}C{\equiv}N$$

wherein $R^2$ is an aliphatic or aromatic group;

$R^3$ is an aliphatic or aromatic group or $R^3$ is selected from the group consisting of ether, carbonyl, sulfone, phosphine oxide and sulfide; and n is 0–10.

3. The electronic circuit package of claim 252 wherein said curable material further comprises a thermosetting monomer or prepolymer selected from the group consisting of epoxy, bismaleimide, benzocyclobutene, bisnadimide and diacetylene resins.

4. The electronic circuit package of claim 1 wherein said curable material is heat curable.

5. The electronic circuit package of claim 4 wherein said curable material is curable within a temperature range of from about 180° C. to about 325° C.

6. The electronic circuit package of claim 4 wherein said curable material is curable within a temperature range of from about 200° C. to about 325° C.

7. The electronic circuit package of claim 1 comprising a plurality of layers wherein at least a part of said electrically conductive pattern is located between said layers.

8. The electronic circuit package of claim 1 wherein said admixture is branched and chain extended.

9. The electronic circuit package of claim 8 comprising a plurality of layers wherein at least a part of said electrically conductive pattern is located between said layers.

10. The electronic circuit package of claim 7 wherein at least one of said layers is formed of a material selected from the group consisting of a thermoplastic resin and a thermoset resin.

11. The electronic circuit package of claim 9 wherein at least one of said layers is formed of a material selected from the group consisting of a thermoplastic resin and a thermoset resin.

* * * * *